US011744098B2

(12) United States Patent
Liang et al.

(10) Patent No.: US 11,744,098 B2
(45) Date of Patent: Aug. 29, 2023

(54) QUANTUM DOT LIGHT-EMITTING DIODE AND PREPARATION METHOD THEREFOR

(71) Applicant: TCL TECHNOLOGY GROUP CORPORATION, Huizhou (CN)

(72) Inventors: Zhurong Liang, Huizhou (CN); Weiran Cao, Huizhou (CN); Lei Qian, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 542 days.

(21) Appl. No.: 17/042,884

(22) PCT Filed: Sep. 27, 2019

(86) PCT No.: PCT/CN2019/108324
§ 371 (c)(1),
(2) Date: Sep. 28, 2020

(87) PCT Pub. No.: WO2020/108068
PCT Pub. Date: Jun. 20, 2020

(65) Prior Publication Data
US 2021/0028384 A1    Jan. 28, 2021

(30) Foreign Application Priority Data

Nov. 26, 2018 (CN) .......................... 201811419198.1

(51) Int. Cl.
*H01L 51/50*    (2006.01)
*H10K 50/155*    (2023.01)
(Continued)

(52) U.S. Cl.
CPC ............. *H10K 50/155* (2023.02); *C08K 3/16* (2013.01); *C09K 11/565* (2013.01);
(Continued)

(58) Field of Classification Search
CPC ............... H10K 50/155; H10K 50/115; H10K 50/165
See application file for complete search history.

(56) References Cited

FOREIGN PATENT DOCUMENTS

CN    102610725 A    7/2012
CN    103594635 A    2/2014
(Continued)

OTHER PUBLICATIONS

Schlapak, R. et al., "Preparation and Characterization of Dense Films of Poly(amidoamine) Dendrimers on Indium Tin Oxide," Langmuir, vol. 23, No. 17, Jul. 17, 2007, pp. 8916-8924.
Latini, G. et al., "Self-assembled Monolayers of Protonated Poly(amidoamine) Dendrimers on Indium Tin Oxide," Applied Physics Letters, vol. 92, (2008), pp. 013511-1-013511-3.
Winroth, G. et al., "Interfacial Dipole Dynamics of Light-emitting Diodes Incorporating a Poly(amidoamine) Dendrimer Monolayer," Applied Physics Letters, vol. 97, (2010), pp. 043304-1-043304-3.
(Continued)

*Primary Examiner* — Anthony Ho
(74) *Attorney, Agent, or Firm* — Anova Law Group, PLLC

(57) ABSTRACT

The present disclosure discloses a quantum dot light-emitting diode and a preparation method therefor, wherein the quantum dot light-emitting diode comprises an anode, a cathode, and a quantum dot light-emitting layer disposed between the anode and the cathode, further includes a first modified layer disposed between the anode and the quantum dot light-emitting layer, comprising PAMAM having transition metal cation doped. The present disclosure, by disposing the first modified layer between the anode and the quantum dot light-emitting layer to modify the anode, is able to increase work function of anode, thereby improving hole injection effect and performance of a device. The present disclosure, by disposing a second modified layer between
(Continued)

the cathode and the quantum dot light-emitting layer to modify the cathode and reduce the work function of the cathode, thereby improves electron injection effect and performance of the device.

20 Claims, 6 Drawing Sheets

(51) Int. Cl.
  *C08K 3/16*  (2006.01)
  *C09K 11/56*  (2006.01)
  *C09K 11/88*  (2006.01)
  *H10K 50/115*  (2023.01)
  *H10K 50/165*  (2023.01)
  *H10K 71/00*  (2023.01)
  *H10K 85/10*  (2023.01)
  *H10K 102/00*  (2023.01)

(52) U.S. Cl.
  CPC .......... *C09K 11/883* (2013.01); *H10K 50/115* (2023.02); *H10K 50/165* (2023.02); *H10K 71/00* (2023.02); *C08K 2201/001* (2013.01); *H10K 85/141* (2023.02); *H10K 2102/351* (2023.02)

(56) References Cited

FOREIGN PATENT DOCUMENTS

| | | |
|---|---|---|
| CN | 107123742 A | 9/2017 |
| CN | 107359264 A | 11/2017 |
| CN | 108695411 A | 10/2018 |

OTHER PUBLICATIONS

Yu, Z. et al., "Metal Ion/Dendrimer Complexes with Tunable Work Functions in a Wide Range and Their Application as Electron- and Hole-Transport Materials of Non-Fullerene Organic Solar Cells," Adv. Funct. Mater, (2018), pp. 1802554 (1-10).

The World Intellectual Property Organization (WIPO) International Search Report for PCT/CN2019/108324 dated Jan. 2, 2020 8 Pages.

QUANTUM DOT LIGHT-EMITTING DIODE AND PREPARATION METHOD THEREFOR

CROSS-REFERENCES TO RELATED APPLICATIONS

This application is a national stage application of PCT Patent Application No. PCT/CN2019/108324, filed on 27 Sep. 2019, which claims priority to Chinese Patent Application No. 201811419198.1, filed on 26 Nov. 2018, the contents of both of which are incorporated herein by reference.

FIELD OF THE INVENTION

The present disclosure relates to the field of quantum dot light-emitting device field, and more particularly, to a quantum dot light-emitting diode and a preparation method therefor.

BACKGROUND

Colloidal quantum dot (CQD) is a semiconductor nanocrystal synthesized on a basis of solution. Colloidal quantum dot has a plurality of characteristics including a narrow luminous line width, a high luminous efficiency, and a plurality of quantum dots of different sizes can be excited by a single wavelength of light before emitting different colors of light, and more, driving a development of a next-generation optoelectronic display technology. A quantum dot light-emitting diode (QLED) with a light-emitting layer made of the colloidal quantum dots is a promising next-generation display and solid lighting source.

In general, a QLED is a multilayer structure composed of a plurality of thin films, including a cathode, a quantum dot light-emitting layer, an anode, together with an electron transport layer (and/or an electron injection layer) disposed between the cathode and the quantum dot light-emitting layer, and a hole transport layer (and/or a hole injection layer) disposed between the anode and the quantum dot light-emitting layer. Wherein, a purpose of disposing a carrier transport layer and a carrier injection layer is mainly for overcoming an energy level difference between an electrode and the quantum dot light-emitting layer too large, resulting in that a plurality of carriers can't be effectively injected into the quantum dot light-emitting layer from the electrode. However, although introducing the carrier transport layer can facilitate an injection of the carriers, in general, different carrier transport layer materials have different energy band structures which are relatively fixed, thus for a specific electrode material and a specific quantum dot luminescent material, it is needed to find a specific material having an energy band matched as the carrier transport layer. Thus, a QLED device with a high-performance will have a high requirement for a carrier transport layer material, a use of the material is relatively simple, and a type of the materials for the electron transport layer and the hole transport layer often differs a lot.

Therefore, the present technology needs to be improved and developed

BRIEF SUMMARY OF THE DISCLOSURE

According to the above described defects in the prior art, a purpose of the present disclosure is providing a quantum dot light-emitting diode and a preparation method therefor, in order to solve a plurality of problems in the prior art that a quantum dot light-emitting diode with a high-performance has a high requirement for the carrier transport layer material, a use of the material is relatively simple, and a type of the materials for the electron transport layer and the hole transport layer often differs a lot.

A technical solution of the present disclosure is as follows:

A quantum dot light-emitting diode including an anode, a quantum dot light-emitting layer and a cathode, the quantum dot light-emitting layer is disposed between the anode and the cathode, wherein further including a first modified layer disposed between the anode and the quantum dot light-emitting layer, the first modified layer includes PAMAM (polyimide-amine dendrimer), and the PAMAM is doped with transition metal cation.

A quantum dot light-emitting diode including an anode, a quantum dot light-emitting layer and a cathode, the quantum dot light-emitting layer is disposed between the anode and the cathode, wherein further including a second modified layer disposed between the cathode and the quantum dot light-emitting layer, the second modified layer includes a PAMAM.

A preparation method of the quantum dot light-emitting diode, wherein including a plurality of steps of:
providing an anode;
preparing a first modified layer on the anode, the first modified layer includes a PAMAM, and the PAMAM is doped with transition metal cation;
preparing a quantum dot light-emitting layer on the first modified layer;
preparing a cathode on the quantum dot light-emitting layer.

Benefits: The present disclosure, by disposing a first modified layer between an anode and a quantum dot light-emitting layer to modify the anode, is able to improve a work function of the anode, thereby improving an injection effect of the holes, further improving a performance of a device. Further, the present disclosure, by disposing a second modified layer between a cathode and the quantum dot light-emitting layer, modifies the cathode, and a work function of the cathode after modified will be reduced, thereby improving an injection effect of the electrons and further improving a performance of the device.

DETAILED DESCRIPTION OF EMBODIMENTS

The present disclosure provides a quantum dot light-emitting diode and a preparation method therefor. in order to make the purpose, technical solution and the advantages of the present disclosure clearer and more explicit, further detailed descriptions of the present disclosure are stated here, referencing to the attached drawings and some embodiments of the present disclosure. It should be understood that the detailed embodiments of the disclosure described here are used to explain the present disclosure only, instead of limiting the present disclosure.

An embodiment of the present disclosure provides a quantum dot light-emitting diode, including an anode, a quantum dot light-emitting layer and a cathode, the quantum dot light-emitting layer is disposed between the anode and the cathode, wherein further including a first modified layer disposed between the anode and the quantum dot light-emitting layer, the first modified layer includes PAMAM, and the PAMAM is doped with transition metal cation.

In the embodiment, by disposing the first modified layer (transition metal cation doped PAMAM) between the anode and the quantum dot light-emitting layer to modify the anode, it is able to improve a work function of the anode, thereby improving an injection effect of a plurality of holes, and further improving a performance of a device.

Figure 1:
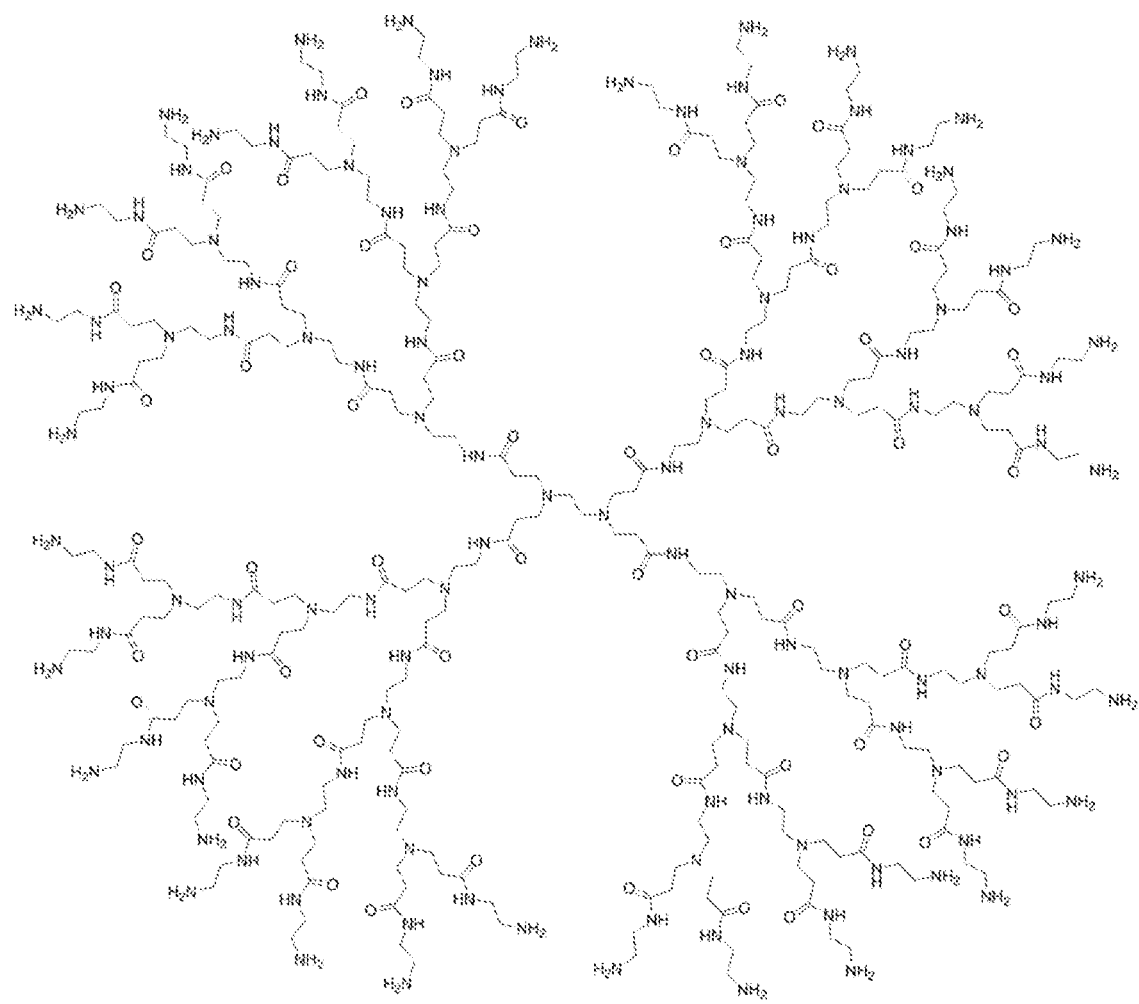
FIG. 1 is a chemical structural formula of PAMAM in an embodiment of the present disclosure.

Specifically, after the anode is modified by the first modified layer, a reason that the work function changes, is that the PAMAM is a dendrimer material, having a large number of amino groups and carbonyl groups on a surface thereof (shown as FIG. 1). After doping transition metal cation, the groups, together with the transition metal cation, will form a complex, making the transition metal cation form a plurality of covalent bonds with N atoms and O atoms in the PAMAM, thereby changing a dipole moment of the PAMAM material, and facilitating an injection of the holes. Therefore, when applying the PAMAM doped with the transition metal cation in modifying the anode, the work function of the anode will be improved.

It is noted that, in the embodiments of the present disclosure, in the first modified layer, in addition to the PAMAM, the PMMA has the transition metal cation doped, a plurality of other impurities may exist in the first modified layer, including a plurality of non-transition metal ions, such as Li/Na/Al/Mg and more, the impurities do not have a beneficial or harmful effect on a function of the first modified layer.

Of course, in the embodiments of the present disclosure, the first modified layer is composed of the PAMAM doped with the transition metal cation, instead of containing other impurities, that makes the skilled in the art may adjust a content ratio of the transition metal cation to the PAMAM better, and change the work function of the anode in a targeted manner.

In some embodiments, the first modified layer is further doped with anion, the anion and the transition metal cation constitute a metal salt. The anion are adsorbed onto a surface of the anode, since there is an electron-pushing effect thereof, an injection of holes may be further promoted.

In some embodiments, a molar ratio of the transition metal cation to the PAMAM in the first modified layer is 0.01-720. By adjusting a doping amount of the transition metal cation in the PAMAM, the work function of the anode can be easily improved in a plurality of different degrees, thereby the injection effect of the holes is improved, and a material selectivity and a device structure design of the quantum dot light-emitting diode can be more abundant, and having more diversities. In an embodiment, when a doping amount (molar ratio) of $Cu^{2+}$ is increased from 0 to 325, the work function of an ITO anode increases gradually from 4.07 eV to 4.97 eV. It is noted that, a commonly used hole injection layer material of the quantum dot light-emitting diodes is PEDOT:PSS, which has a work function of 5.05 eV, indicating that after doping with $Cu^{2+}$ in a high concentration, a work function of the PAMAM modified ITO is close to that of a PEDOT:PSS material, that is, the PAMAM modified ITO has a good hole injection performance.

In some embodiments, the transition metal in the transition metal cation may include, but not limited to, one or more of Cu, Ni, Zn, Co, Fe, Mn, Cr, V, Ti, Sc, Y, Zr, Nb, Mo, Tc, Ru, Rh, Pb, Ag, Cd, Hf, Ta, W, Re, Os, Ir, Pt, Au and Hg. In the embodiment, by adjusting a material type of the transition metal cation, it is possible to increase the work function of the anode easily in different degrees, thereby improving the injection effect of holes. Further, in some embodiments, the transition metal in the transition metal cation may be selected from, but not limited to, one or more of Cu, Ni, Co, Fe, Mn, Cr, V, Ti, Y, Zr, Mo, Zr, and Ru.

Further, in some embodiments, the anion may include, but not limited to, one or more of $Cl^-$, $CO^{3-}$, $S^{2-}$, $SO_4^{2-}$, $SO_3^{2-}$, $MnO_4^{2-}$, $MnO^{4-}$, $PO_4^{3-}$, $NO^{3-}$, $NO^{2-}$, $ClO_3^-$, $ClO^-$, $ClO_2^-$, $ClO_4^-$, $CN^-$, $AlO^{2-}$, $AlO_3^{3-}$, $C_2O_7^{2-}$, $FeO_4^{2-}$, $Cr_2O_7^{2-}$, $CrO_4^{2-}$ and $SeO_4^{2-}$.

In some embodiments, a thickness of the first modified layer is 2-110 nm.

In some embodiments, the quantum dot light-emitting diode further includes a second modified layer disposed between the cathode and the quantum dot light-emitting layer, wherein the second modified layer includes PAMAM.

In the embodiment, by disposing the second modified layer between the cathode and the quantum dot light-emitting layer to modify the cathode, a work function of the cathode after being modified will be reduced, thereby an injection effect of the electrons will be improved, and a performance of the device will be further improved. Specifically, after the cathode is modified by the second modified layer, a reason that the work function thereof changes, is that the PAMAM is a dendrimer material, having a large number of amino groups and carbonyl groups on a surface thereof (shown as FIG. 1). After modifying the cathode with the PAMAM, a dipole moment formed may reduce the work function of the cathode, which is conducive to an injection of the electrons.

Similarly, in addition to the PAMAM, there may also have a plurality of other impurities exist in the second modified layer, and the impurities do not have a beneficial or harmful effect on an action of the second modified layer.

Of course, in the embodiment of the present disclosure, the second modified layer is PAMAM, that makes those skilled in the art be able to realize an adjustment of the work function of the cathode by regulating the PAMAM only.

Further, in some embodiments, a thickness of the second modified layer is 5-96 nm. By adjusting the thickness of the second modified layer, the work function of the cathode can be easily reduced in different degrees, thereby the injection effect of the electrons is improved, and the material selectivity and the device structure design of the quantum dot light-emitting diode can be more abundant, and having more diversities.

In some embodiments, an anode material may include, but not limited to, one or more of a metal material, a carbon material, a metal oxide and a hole injection material. Further, in some embodiments, the metal material may include one or more of Al, Ag, Cu, Mo, Au, Ba, Ca, and Mg. Further in some embodiments, the carbon material may include one or more of graphite, carbon nanotubes, graphene and carbon fiber. The metal oxide may be a doped or undoped metal oxide, which include one or more of ITO, FTO, ATO, AZO, GZO, IZO, MZO and AMO, the metal oxide may also be composite electrode having a metal sandwiched between doped or undoped transparent metal oxides, wherein the composite electrode may include one or more of AZO/Ag/AZO, AZO/Al/AZO, ITO/Ag/ITO, ITO/Al/ITO, ZnO/Ag/ZnO, ZnO/Al/ZnO, TiO$_2$/Ag/TiO$_2$, TiO$_2$/Al/TiO$_2$, ZnS/Ag/ZnS, and ZnS/Al/ZnS. Further in some embodiments, the hole injection material may include, but not limited to, one or more of PEDOT: PSS, CuPc, F4-TCNQ, HATCN, a transition metal oxide and a transition metal chalcogenide. Wherein, the transition metal oxide may include one or more of NiO$_x$, MoO$_x$, WO$_x$, CrO$_x$ and CuO; the metal chalcogenide may include one or more of MoS$_x$, MoSe$_x$, WS$_x$, WSe$_x$ and CuS. In the embodiment, by adjusting a material type of a transition anode, it is possible to improve the work function of the anode easily in different degrees, thereby improving the injection effect of the holes. In an embodiment, when the Cu$^{2+}$ has a doping amount (molar ratio) of 325, the work functions of a modified gold anode (Au), a modified silver anode (Ag), and a modified reduced graphene anode (RGO) are increased from 4.98 eV, 4.45 eV, and 5.20 to 5.14 eV, 4.87 eV, 5.42 eV respectively.

In some embodiments, a cathode material may include, but not limited to, one or more of a metal material, a carbon material, and a metal oxide. In an embodiment, the metal material may include one or more of Al, Ag, Cu, Mo, Au, Ba, Ca and Mg. In an embodiment, the carbon material may include one or more of a graphite, a carbon nanotube, a graphene and a carbon fiber. The metal oxide may be a doped or undoped metal oxide, in an embodiment, the metal oxide may including one or more of ITO, FTO, ATO, AZO, GZO, IZO, MZO and AMO, the metal oxide may also be a composite electrode with a metal sandwiched between doped or undoped transparent metal oxides, including one or more of AZO/Ag/AZO, AZO/Al/AZO, ITO/Ag/ITO, ITO/Al/ITO, ZnO/Ag/ZnO, ZnO/Al/ZnO, TiO$_2$/Ag/TiO$_2$, TiO$_2$/Al/TiO$_2$, ZnS/Ag/ZnS, and ZnS/Al/ZnS. By modifying the cathode in a plurality of different materials, the work function of the cathode can be easily reduced in different degrees, thereby the injection effect of the electrons is improved, and the material selectivity and the device structure design of the quantum dot light-emitting diode can be more abundant and having more diversities. In an embodiment, for a gold cathode (Au), a silver cathode (Ag), and a reduced graphene oxide cathode (RGO), after being modified with the PAMAM, the work functions thereof are reduced from 4.98 eV, 4.45 eV, 5.20 eV to 3.66 eV, 3.74 eV, 4.27 eV respectively.

In the embodiment, the quantum dot light-emitting diode may further include a hole function layer disposed between the first modified layer and the quantum dot light-emitting layer. The hole function layer may include one or two of a hole injection layer and a hole transport layer. When the hole function layer includes both the hole injection layer and the hole transport layer, the hole transport layer is arranged sticking to the quantum dot light-emitting layer.

In some embodiments, a material of the hole injection layer is a material having a good hole injection performance, including, but not limited to, poly(3,4-ethylenedioxythiophene)-poly(styrenesulphonic acid) (PEDOT:PSS), copper phthalocyanine (Cu Pc), 2,3,5,6-tetrafluoro-7,7',8,8'-tetracyanoquinodimethane (F4-TCNQ), 2,3,6,7,10,11-hexacyano-1,4,5,8,9,12-hexaazatriphenylene (HATCN), a transition metal oxide, a transition metal chalcogenide; wherein the transition metal oxide may include one or more of NiO$_x$, MoO$_x$, WO$_x$, CrO$_x$ and CuO; the metal chalcogenide may include one or more of MoS$_x$, MoSe$_x$, WS$_x$, WSe$_x$ and CuS.

In some embodiments, a material of the hole transport layer is an organic material having a good hole transport capability, including but not limited to, one or more of poly(9,9-dioctylfluorene-CO—N-(4-butylphenyl)-diphenylamine) (TFB), polyvinylcarbazole (PVK), poly(N,N'-bis(4-butylphenyl)-N,N'-bis(phenyl)benzidine) (Poly-TPD), poly(9,9-dioctylfluorene-co-bis-N,N-phenyl-1,4-phenylenediamine) (PFB), 4,4',4''-tri(carbazoyl-9-yl)triphenylamine (TCTA), 4,4'-bis(9-carbazole)-biphenyl (CBP), N, N'-diphenyl-N, N'-bis(3-methylphenyl)-1, 1'-biphenyl-4,4'-diamine (TPD), N,N'-diphenyl-N,N'-(1-naphthyl)-1,1'-biphenyl-4,4'-diamine (NPB), graphene and C60. In some embodiments, the hole transport layer may also be selected from a plurality of inorganic materials having a hole transport capability, including but not limited to, one or more of NiO$_x$, MoO$_x$, WO$_x$, CrO$_x$, CuO, MoS$_x$, MoSe$_x$, WS$_x$, WSe$_x$ and CuS.

In the embodiment, the quantum dot light-emitting diode may further include an electron function layer disposed between the cathode and the quantum dot light-emitting layer. When the quantum dot light-emitting diode has the second modified layer included, the electron function layer is disposed between the second modified layer and the quantum dot light-emitting layer. Wherein the electron function layer may be selected from one or two of an electron injection layer and an electron transport layer. When the electron function layer includes both the electron injection layer and the electron transport layer, the electron transport layer is arranged sticking to the quantum dot light-emitting layer.

In some embodiments, both materials of the electron transport layer and the electron injection layer are inorganic material and/or organic material with an electron transport capability, for example, the inorganic materials with the electron transport capability may be selected from one or more of a doped or undoped metal oxide, a doped or undoped metal sulfide. Wherein, the doped or undoped metal oxide may include one or more of ZnO, TiO$_2$, SnO$_2$, Ta$_2$O$_3$, ZrO$_2$, NiO, TiLiO, ZnAlO, ZnMgO, ZnSnO, ZnLiO and InSnO. The doped or undoped metal sulfide may include one or more of CdS, ZnS, MoS, WS and CuS.

In the embodiment, a material of the quantum dot light-emitting layer may include but not limited to, one or more of a II-VI compound, a III-V compound, a II-V compound, a III-VI compound, a IV-VI compound, a compound, a II-IV-VI compound, or a IV simple substance. In an embodiment, the materials of the quantum dot light-emitting layer may include but not limited to, one or more of CdS, CdSe, CdTe, ZnS, ZnSe, ZnTe, HgS, HgSe, HgTe, PbS, PbSe, PbTe and other binary, ternary, and quaternary II-VI compounds. In an embodiment, the material of the quantum dot light-emitting layer may include but not limited to, one or more of GaP, GaAs, InP, InAs, and other binary, ternary, and quaternary III-V compounds.

In the embodiment, the material of the quantum dot light-emitting layer may be a doped or undoped inorganic perovskite semiconductor and/or an organic-inorganic hybrid perovskite semiconductor. Wherein, a structural formula of the inorganic perovskite semiconductor is $AMX_3$, where A is $Cs^+$ ion; M is a divalent metal cation, which may include, but not limited to, $Pb^{2+}$, $Sn^{2+}$, $Cu^{2+}$, $Ni^{2+}$, $Cd^{2+}$, $Cr^{2+}$, $Mn^{2+}$, $Co^{2+}$, $Fe^{2+}$, $Ge^{2+}$, $Yb^{2+}$ or $Eu^{2+}$, X is a halogen anion, which may include, but not limited to, $Cl^-$, $Br^-$ or $I^-$. Wherein, a structural formula of the organic-inorganic hybrid perovskite semiconductor is $BMX_3$, where B is an organic amine cation, which can be selected from, but not limited to, $CH_3(CH_2)_{n-2}NH_3^+$ ($n \geq 2$) or $NH_3(CH_2)_n NH_3^{2+}$ ($n \geq 2$), when n=2, an inorganic metal halide octahedron $MX_6^{4-}$ is connected by a method of co-topping, a metal cation M locates in a body center of a halogen octahedron, and an organic amine cation B is filled in a gap in between the octahedron to form an three-dimensional structure extending infinitely, when n>2, an inorganic metal halide octahedron $MX_6^{4-}$ connected by the method of co-topping extends in a two-dimensional direction to form a layered structure, with an organic amine cation bilayer (protonated monoamine) or an organic amine cation monolayer (protonated diamine) inserted between the layers, a plurality of organic layers and a plurality of inorganic layers overlap each other and form a stable two-dimensional layered structure; M is a divalent metal cation, which may be selected from, but not limited to, $Pb^{2+}$, $Sn^{2+}$, $Cu^{2+}$, $Ni^{2+}$, $Cd^{2+}$, $Cr^{2+}$, $Mn^{2+}$, $Co^{2+}$, $Fe^{2+}$, $Ge^{2+}$, $Yb^{2+}$, $Eu^{2+}$; X is a halogen anion which may be selected from, but not limited to, $Cl^-$, $Br^-$ or $I^-$.

It is noted that, the quantum dot light-emitting diode may further include an interface modified layer, and the interface modified layer may be selected from one or more of an electron blocking layer, a hole blocking layer, an electron injection layer, an electrode modified layer, and an isolation protection layer.

In the embodiment, the quantum dot light-emitting diode may be partially packaged, fully packaged or unpackaged.

An embodiment of the present disclosure provides a quantum dot light-emitting diode, including an anode, a quantum dot light-emitting layer, and a cathode, the quantum dot light-emitting layer is disposed between the anode and the cathode, wherein further including a second modified layer disposed between the cathode and the quantum dot light-emitting layers, the second modified layer comprises PAMAM. In the embodiment, by disposing the second modified layer between the cathode and the quantum dot light-emitting layer to modify the cathode, and a work function of the cathode being modified will be reduced, thereby improves the electron injection effect and further improves the performance of the device. Specifically, after the cathode is modified by the second modified layer, a reason that the work function thereof changes is that PAMAM is a dendrimer material with a plurality of amino groups and a plurality of carbonyl groups on the surface thereof (shown as FIG. 1). After applying the PAMAM to modifying the cathode, a dipole moment formed may reduce the work function of the cathode, which is therefore conducive to an injection of the electrons.

Figure 2:
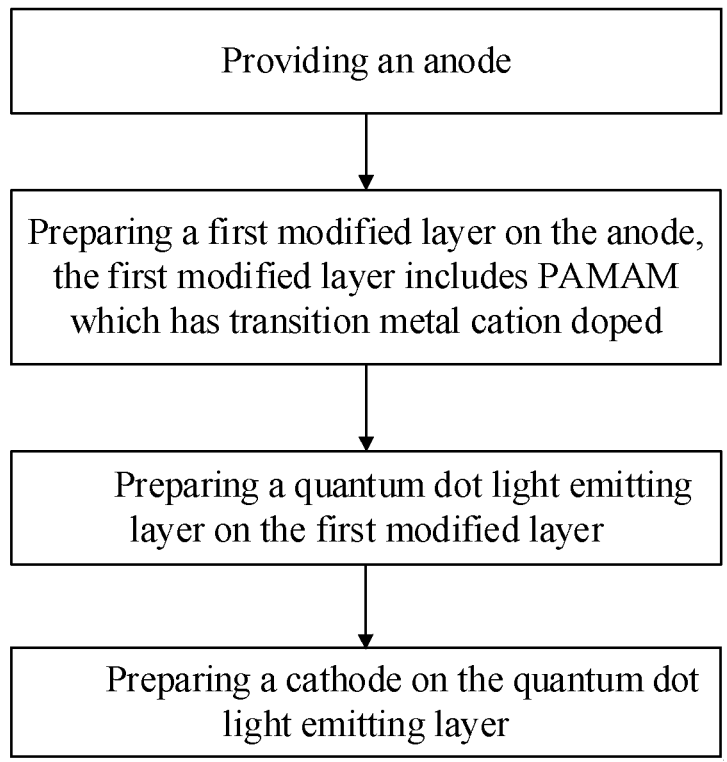
FIG. 2 is a schematic flow chart on a preparation method for the quantum dot light-emitting diode provided by the present disclosure.

The present disclosure further provides a preparation method of the quantum dot light-emitting diode, shown as FIG. 2, including a plurality of following steps:
providing an anode,
preparing a first modified layer on the anode, the first modified layer comprises PAMAM, the PAMAM has transition metal cation doped,
preparing a quantum dot light-emitting layer on the first modified layer,
preparing a cathode on the quantum dot light-emitting layer.

In the present disclosure, a deposition method of each layer may be a chemical method or a physical method, wherein the chemical method includes but not limited to, one or more of a chemical vapor deposition method, a continuous ion layer adsorption and a reaction method, an anodic oxidation method, an electrolytic deposition method, and a co-precipitation method; the physical method include, but are not limited to, one or more of a spin coating method, a printing method, a scraping method, a dip-coating method, a dipping method, a spraying method, a roll coating method, a casting method, a slot coating method, a strip coating cloth method, a thermal evaporation coating method, an electron beam evaporation coating method, a magnetron sputtering method, a multi-arc ion coating method, a physical vapor deposition method, an atomic layer deposition method, a pulse laser deposition method.

It is noted that, in the embodiment of the present disclosure, other than comprising the PAMAM, while the PAMAM is doped with the transition metal cation, the first modified layer may further comprise a plurality of other impurities, including a plurality of non-transition metal ions of Li/Na/Al/Mg or more, and the impurities do not have a beneficial or harmful effect on a function of the first modified layer.

Of course, in an embodiment of the present disclosure, the first modified layer is composed of PAMAM doped with the transition metal cation, instead of any other impurities, so that those skilled in the art may adjust a content ratio of the transition metal cation to the PAMAM better, and change the work function of the anode in a targeted manner.

In some embodiments, the first modified layer has further anion doped, and the anion together with the transition metal cation form a metal salt. The anion may be adsorbed on a surface of the anode, and due to an electron-pushing effect thereof, the injection of the holes may be further promoted.

In some embodiments, the steps of preparing the quantum dot light-emitting layer on the first modified layer and preparing the cathode on the quantum dot light-emitting layer include: preparing a quantum dot light-emitting on the first modified layer, preparing a second modified layer on the quantum dot light-emitting layer, and preparing a cathode on the second modified layer; the second modified layer includes PAMAM. In the embodiment, by disposing the second modified layer between the cathode and the quantum dot light-emitting layer, before modifying the cathode, a work function of the modified cathode will be reduced, thereby the electron injection effect will be improved and further a performance of the device will be improved. Further, after the cathode is modified by the second modified layer, a reason of the work function thereof changes is that, since the PAMAM is a dendrimer material, having a plurality of amino groups and a plurality of carbonyl groups on the surface thereof (shown as FIG. 1). After modifying the cathode with the PAMAM, a dipole moment formed may reduce the work function of the cathode, which is conducive to the injection of the electrons.

Similarly, other than comprising the PAMAM, the second modified layer may further comprise a plurality of other impurities, the impurities do not have a beneficial or harmful effect on an action of the second modified layer.

Of course, in an embodiment of the present disclosure, the second modified layer is PAMAM, that makes those skilled in the art be able to realize an adjustment of the work function of the cathode by regulating the PAMAM only.

Further in some embodiments, a thickness of the second modified layer is 5-96 nm. By adjusting the thickness of the second modified layer, it is possible to reduce the work function of the cathode in different degrees, thereby improving the injection effect of the electrons, and making the material selectivity and the device structure design of the quantum dot light-emitting diode more abundant, having more diversities.

In some embodiments, a molar ratio of the transition metal cation to the PAMAM in the first modified layer is 0.01-720. By adjusting a doping amount of the transition metal cation in the PAMAM, it is possible to improve the work function of the anode easily in different degrees, thereby improving the injection effect of the holes, and making the material selectivity and the device structure design of the quantum dot light-emitting diode more abundant, having more diversities. In an embodiment, when the doping amount (molar ratio) of $Cu^{2+}$ increases from 0 to 325, the work function of the ITO anode gradually increases from 4.07 eV to 4.97 eV. It should be noted that, a commonly used hole injection layer material of the quantum dot light-emitting diode is PEDOT:PSS, and the work function thereof is 5.05 eV, indicating that after doping $Cu^{2+}$ in a high concentration into the PAMAM, the work function of the ITO after being modified is close to the work function of PEDOT:PSS, that is, it has a good hole injection performance.

In some embodiments, the transition metal in the transition metal cation may include, but not limited to, one or more of Cu, Ni, Zn, Co, Fe, Mn, Cr, V, Ti, Sc, Y, Zr, Nb, Mo, Tc, Ru, Rh, Pb, Ag, Cd, Hf, Ta, W, Re, Os, Ir, Pt, Au and Hg. In the embodiment, by adjusting a material type of the transition metal cation, it is possible to improve the work function of the anode in different degrees, thereby improving the injection effect of the holes. The transition metal in the transition metal cation may be selected from, but not limited to, one or more of Cu, Ni, Co, Fe, Mn, Cr, V, Ti, Y, Zr, Mo and Ru.

Further, in some embodiments, the anion may include but not limited to, one or more of $Cl^-$, $CO_3^-$, $S^{2-}$, $SO_4^{2-}$, $SO_3^{2-}$, $MnO_4^{2-}$, $MnO_4^-$, $PO_4^{3-}$, $NO_3^-$, $NO_2^-$, $ClO_3^-$, $ClO^-$, $ClO_2^-$, $ClO_4^-$, $CN^-$, $AlO_2^-$, $AlO_3^{3-}$, $C_2O_4^{2-}$, $FeO_4^{2-}$, $Cr_2O_7^{2-}$, $CrO_4^{2-}$ and $SeO_4^{2-}$.

In some embodiments, a thickness of the first modified layer is 2-110 nm. More detailed descriptions are described hereafter, referencing to a plurality of embodiments listed below.

Embodiment 1

Figure 3:
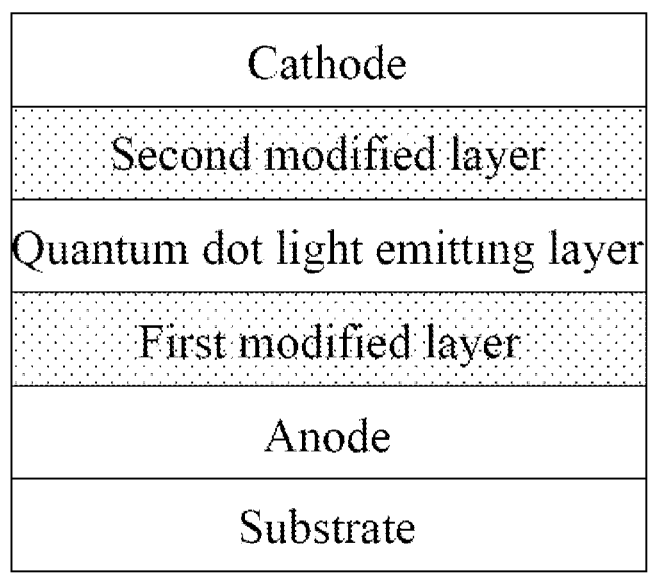
FIG. 3 is a schematic structural diagram of a quantum dot light-emitting diode according to embodiment 1 of the present disclosure.

Referencing to FIG. 3, a quantum dot light-emitting diode, wherein a preparation process thereof is as follows:

first dissolving the PAMAM in methanol, before adding $CuCl_2$, wherein a molar ratio of the $CuCl_2$ to the PAMAM is 275:1, followed by stirring a mixed solution thereof for 8 hours, and setting aside; in addition, preparing a isopropanol solution of the PAMAM, and setting aside;

spin-coating the mixed solution on a piece of ITO conductive glass before heating at 100° C. for 30 min, and obtaining an ITO anode modified by a $Cu^{2+}$ doped PAMAM;

spin-coating a CdSe/ZnS quantum dot light-emitting layer on the ITO anode modified by the $Cu^{2+}$ doped PAMAM;

spin-coating the isopropanol solution of the PAMAM on the CdSe/ZnS quantum dot light-emitting layer, before heating at 80° C. for 15 min and forming a PAMAM modified layer;

vapor-depositing an Al cathode layer on the PAMAM modified layer and obtaining a quantum dot light-emitting diode.

Embodiment 2

Figure 4:
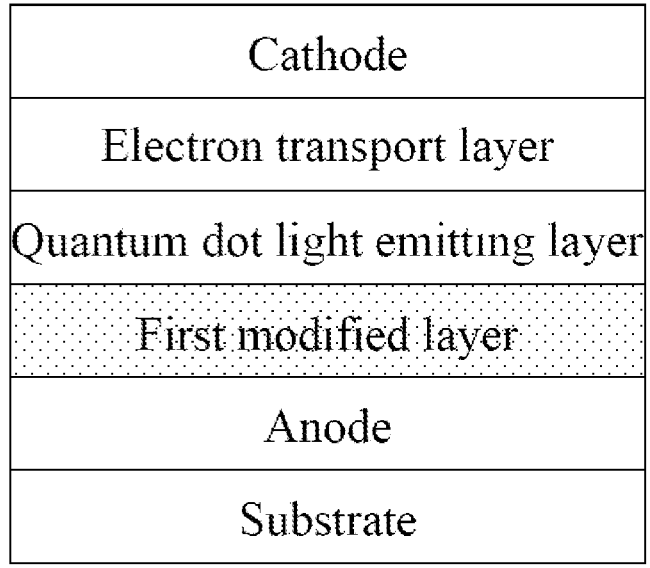
FIG. 4 is a schematic structural diagram of a quantum dot light-emitting diode according to embodiment 2 of the present disclosure.

Referencing to FIG. 4, a quantum dot light-emitting diode, wherein a preparation process thereof is as follows:

first dissolving the PAMAM in methanol, before adding $CuCl_2$, wherein a molar ratio of the $CuCl_2$ to the PAMAM is 275:1, followed by stirring a mixed solution thereof for 8 hours before being set aside;

spin-coating the mixed solution on a piece of ITO conductive glass before heating at 100° C. for 30 min, and obtaining an ITO anode modified by a $Cu^{2+}$ doped PAMAM;

spin-coating a CdSe/ZnS quantum dot light-emitting layer on the ITO anode modified by the $Cu^{2+}$ doped PAMAM;

spin-coating a ZnO electron transport layer on the CdSe/ZnS quantum dot light-emitting layer;

vapor-depositing an Al cathode layer on the ZnO electron transport layer and obtaining a quantum dot light-emitting diode.

Embodiment 3

Figure 5:
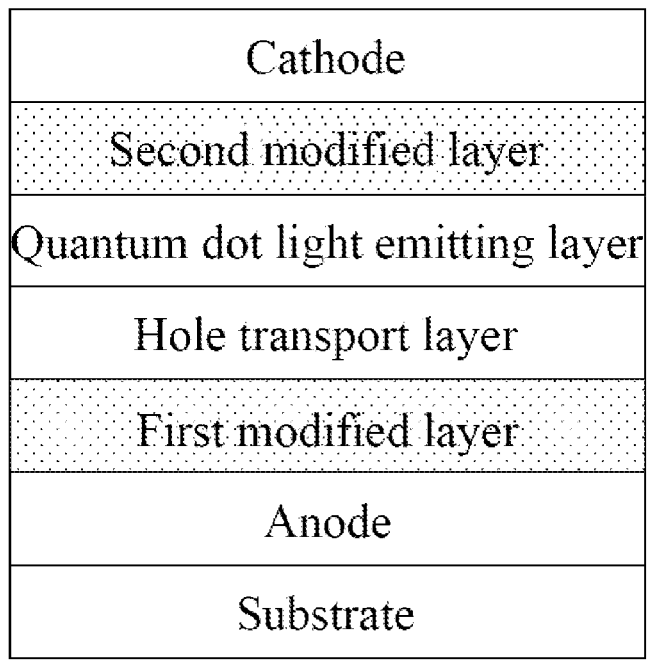
FIG. 5 is a schematic structural diagram of a quantum dot light-emitting diode according to embodiment 3 of the present disclosure.

Referencing to FIG. 5, a quantum dot light-emitting diode, wherein a preparation process thereof is as follows:

first dissolving the PAMAM in methanol, before adding $CuCl_2$, wherein a molar ratio of the $CuCl_2$ to the PAMAM is 275:1, followed by stirring a mixed solution thereof for 8 hours and setting aside, in addition, preparing an isopropanol solution of the PAMAM and setting aside;

spin-coating the mixed solution on a piece of ITO conductive glass before heating at 100° C. for 30 min, and obtaining an ITO anode modified by a $Cu^{2+}$ doped PAMAM;

spin-coating a TFB hole transport layer on the ITO anode modified by the $Cu^{2+}$ doped PAMAM;

spin-coating a CdSe/ZnS quantum dot light-emitting layer on the TFB hole transport layer;

spin-coating the isopropanol solution of the PAMAM on the CdSe/ZnS quantum dot light-emitting layer before heating at 80° C. for 15 min to obtain a PAMAM modified layer;

vapor-depositing an Al cathode layer on the PAMAM modified layer to obtain a quantum dot light-emitting diode.

Embodiment 4

Figure 6:
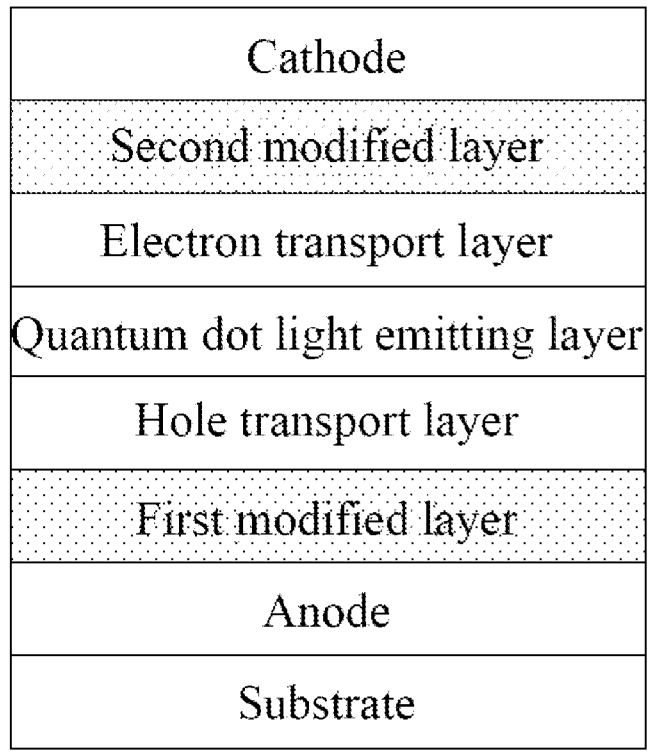
FIG. 6 is a schematic structural diagram of a quantum dot light-emitting diode according to embodiment 4 of the present disclosure.

Referencing to FIG. 6, a quantum dot light-emitting diode, wherein a preparation process thereof is as follows:

first dissolving the PAMAM in methanol, before adding $CuCl_2$, wherein a molar ratio of the $CuCl_2$ to the PAMAM is 275:1, followed by stirring a mixed solution thereof for 8 hours and setting aside, in addition preparing an isopropanol solution of the PAMAM and setting aside;

spin-coating the mixed solution on a piece of ITO conductive glass before heating at 100° C. for 30 min to obtain an ITO anode modified by a $Cu^{2+}$ doped PAMAM;

spin-coating a TFB hole transport layer on the ITO anode modified by the $Cu^{2+}$ doped PAMAM;

spin-coating a CdSe/ZnS quantum dot light-emitting layer on the TFB hole transport layer;

spin-coating a ZnO electron transport layer on the CdSe/ZnS quantum dot light-emting layer;

spin-coating an isopropanol solution of the PAMAM on the ZnO electron transport layer before heating at 80° C. for 15 min to obtain a PAMAM modified layer;

vapor-depositing an Al cathode layer on the PAMAM modified layer to obtain a quantum dot light-emitting diode.

Embodiment 5

Figure 7:
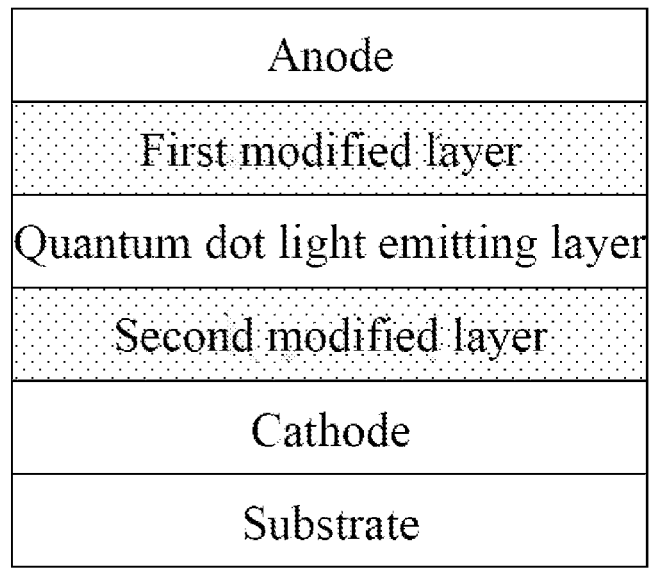
FIG. 7 is a schematic structural diagram of a quantum dot light-emitting diode according to embodiment 5 of the present disclosure.

Referencing to FIG. 7, a quantum dot light-emitting diode, wherein a preparation process thereof as follows:

first dissolving the PAMAM in methanol, before adding $CuCl_2$, wherein a molar ratio of the $CuCl_2$ to the PAMAM is 275:1, followed by stirring a mixed solution thereof for 8 hours and setting aside, in addition preparing an isopropanol solution of the PAMAM and setting aside;

spin-coating the PAMAM isopropanol solution on a piece of ITO conductive glass before heating at 80° C. for 15 min and obtaining an ITO cathode modified by the PAMAM;

spin-coating a CdSe/ZnS quantum dot light-emitting layer on the ITO cathode modified by the PAMAM;

spin-coating the mixed solution on the CdSe/ZnS quantum dot light-emting layer before heating at 90° C. for 20 min to obtain a $Cu^{2+}$ doped PAMAM modified layer;

vapor-depositing an Au anode layer on the $Cu^{2+}$ doped PAMAM modified layer to obtain a quantum dot light-emitting diode.

Embodiment 6

Figure 8:
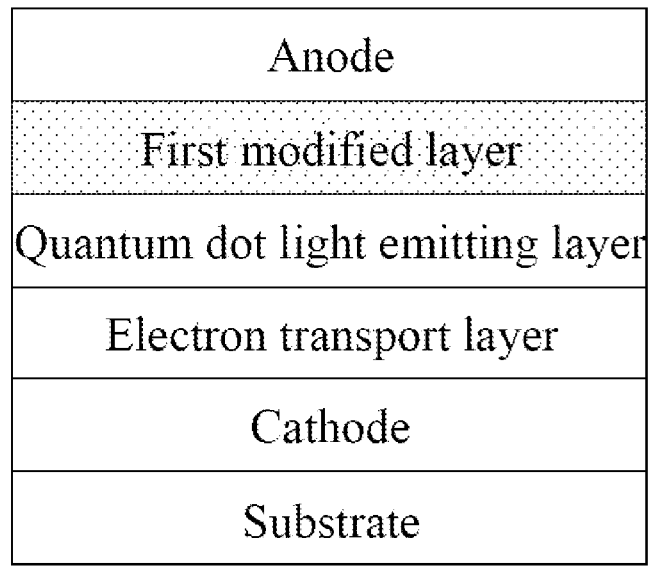
FIG. 8 is a schematic structural diagram of a quantum dot light-emitting diode according to embodiment 6 of the present disclosure.

Referencing to FIG. 8, a quantum dot light-emitting diode, wherein a preparation process thereof is as follows:

first dissolving the PAMAM in methanol, before adding $CuCl_2$, wherein a molar ratio of the $CuCl_2$ to the PAMAM is 275:1, followed by stirring a mixed solution thereof for 8 hours and setting aside;

spin-coating a zinc oxide electron transport layer on a piece of ITO conductive glass;

spin-coating a CdSe/ZnS quantum dot light-emitting layer on the zinc oxide electron transport layer;

spin-coating the mixed solution on the CdSe/ZnS quantum dot light-emitting layer before heating at 90° C. for 20 min to obtain a $Cu^{2+}$ doped PAMAM modified layer;

vapor-depositing an Au anode layer on the $Cu^{2+}$ doped PAMAM modified layer to obtain a quantum dot light-emitting diode.

Embodiment 7

Figure 9:
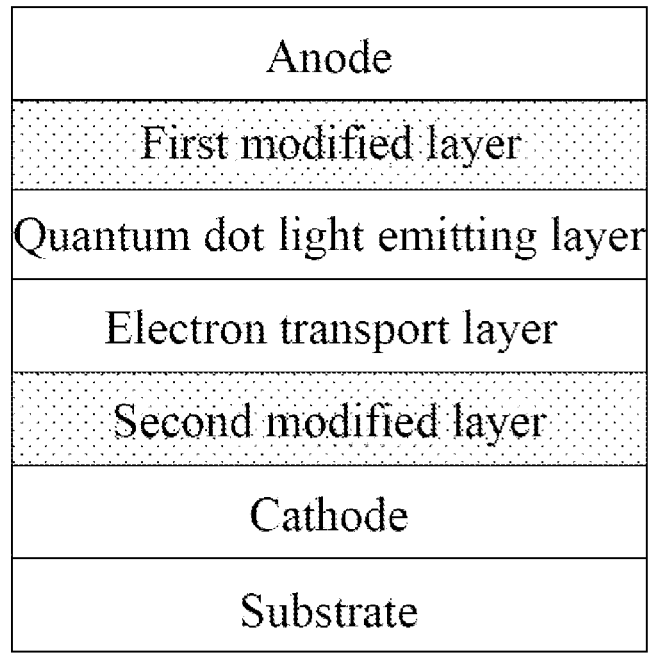
FIG. 9 is a schematic structural view of a quantum dot light-emitting diode of embodiment 7 of the present disclosure.

Referencing to FIG. 9, a quantum dot light-emitting diode, wherein a preparation process thereof as follows:

first dissolving the PAMAM in methanol, before adding $CuCl_2$, wherein a molar ratio of the $CuCl_2$ to the PAMAM is 275:1, followed by stirring a mixed solution thereof for 8 hours and setting aside, in addition preparing a PAMAM isopropanol solution and setting aside;

spin-coating the PAMAM isopropanol solution on a piece of ITO conductive glass before heating at 80° C. for 15 min and obtaining an ITO cathode modified by the PAMAM;

spin-coating a ZnO electron transport layer on the ITO cathode modified by the PAMAM;

spin-coating a CdSe/ZnS quantum dot light-emting layer on the ZnO electron transport layer;

spin-coating the mixed solution on the CdSe/ZnS quantum dot light-emting layer before heating at 90° C. for 20 min to obtain a $Cu^{2+}$ doped PAMAM modified layer;

vapor-depositing an Au anode layer on the $Cu^{2+}$ doped PAMAM modified layer to obtain a quantum dot light-emitting diode.

Embodiment 8

Figure 10:
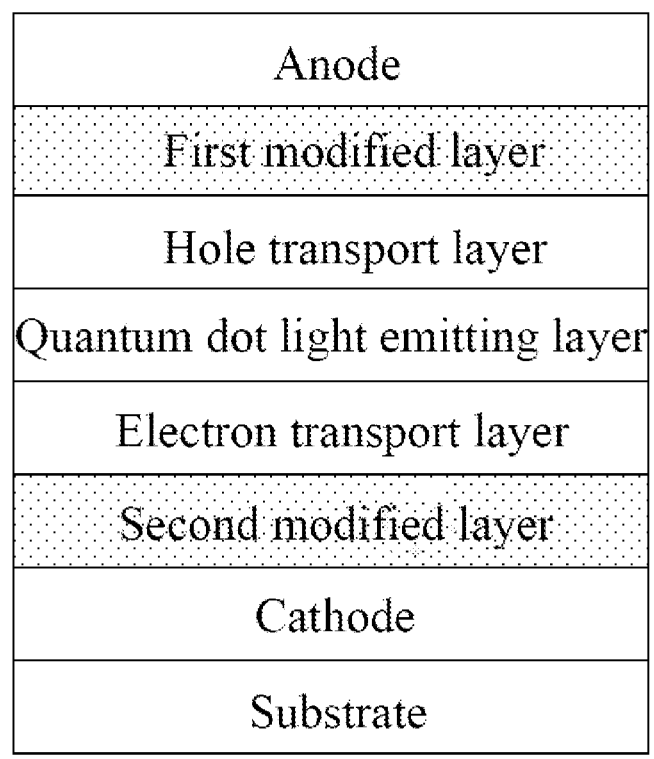
FIG. 10 is a schematic structural diagram of a quantum dot light-emitting diode according to embodiment 8 of the present disclosure.

Referencing to FIG. 10, a quantum dot light-emitting diode, wherein a preparation process thereof as follows:

first dissolving the PAMAM in methanol, before adding $CuCl_2$, wherein a molar ratio of the $CuCl_2$ to the PAMAM is 275:1, followed by stirring a mixed solution thereof for 8 hours and setting aside, in addition preparing an isopropanol solution of the PAMAM and setting aside;

spin-coating the isopropanol solution of the PAMAM on a piece of ITO conductive glass before heating at 80° C. for 15 min to obtain an ITO cathode modified by the PAMAM;

spin-coating a ZnO electron transport layer on the ITO cathode modified by the PAMAM;

spin-coating a CdSe/ZnS quantum dot light-emitting layer on the ZnO electron transport layer;

spin-coating a TFB hole transport layer on the CdSe/ZnS quantum dot light-emting layer;

spin-coating the mixed solution on the TFB hole transport layer before heating at 90° C. for 20 min to obtain a $Cu^{2+}$ doped PAMAM modified layer;

vapor-depositing an Au anode layer on the $Cu^{2+}$ doped PAMAM modified layer to obtain a quantum dot light-emitting diode.

All above, the present disclosure, by disposing a first modified layer (a transition metal cation doped PAMAM) between an anode and a quantum dot light-emitting layer to modify the anode, it is possible to improve a work function of the anode, thereby improving an Injection effect of the holes, and further improving a performance of a device. The present disclosure may further dispose a second modified layer between a cathode and the quantum dot light-emitting layer to modify the cathode, while a work function of the cathode being modified may be reduced, thereby improving an injection effect of the electrons and further improving a performance of the device.

It should be understood that the application of the present disclosure is not limited to the above examples. For those skilled in the art, improvements or changes can be made according to the above description, and all such improvements and changes should fall within the protection scope of the appended claims of the present disclosure.

What is claimed is:

1. A quantum dot light-emitting diode, comprising an anode, a quantum dot light-emitting layer and a cathode, the quantum dot light-emitting layer is arranged between the anode and the cathode, wherein further comprising a first modified layer arranged between the anode and the quantum dot light-emitting layer, the first modified layer comprises PAMAM, the PAMAM has transition metal cation doped.

2. The quantum dot light-emitting diode according to claim 1, wherein the first modified layer is composed of the PAMAM having the transition metal cation doped.

3. The quantum dot light-emitting diode according to claim 1, wherein the PAMAM has anion doped.

4. The quantum dot light-emitting diode according to claim 1, wherein further comprising a second modified layer arranged between the cathode and the quantum dot light-emitting layer, the second modified layer comprises PAMAM.

5. The quantum dot light-emitting diode according to claim 1, wherein a molar ratio of the transition metal cation to the PAMAM in the first modified layer is 0.01-720.

6. The quantum dot light-emitting diode according to claim 1, wherein a transition metal of the transition metal cation is one or more selected from the group consisting of Cu, Ni, Zn, Co, Fe, Mn, Cr, V, Ti, Sc, Y, Zr, Nb, Mo, Tc, Ru, Rh, Pb, Ag, Cd, Hf, Ta, W, Re, Os, Ir, Pt, Au and Hg.

7. The quantum dot light-emitting diode according to claim 3, wherein the anion is one or more selected from the group consisting of $Cl^-$、$CO_3^-$、$S^{2-}$、$SO_4^{2-}$、$SO_3^{2-}$、$MnO_4^2$、$MnO_4^-$、$PO_4^{3-}$、$NO_3^-$、$NO_2^-$、$ClO_3^-$、$ClO^-$、$ClO_2^-$、$ClO_4^-$、$CN^-$、$AlO_2^-$、$AlO_3^{3-}$、$C_2O_4^{2-}$、$FeO_4^{2-}$、$Cr_2O_7^{2-}$、$CrO_4^{2-}$ and $SeO_4^{2-}$.

8. The quantum dot light-emitting diode according to claim 1, wherein a material of the anode is one or more selected from the group consisting of metal material, carbon material, metal oxide and hole injection material; and/or
 a material of the cathode is one or more selected from the group consisting of metal material, carbon material and metal oxide.

9. The quantum dot light-emitting diode according to claim 1, wherein a thickness of the first modified layer is 2-110 nm.

10. The quantum dot light-emitting diode according to claim 4, wherein a thickness of the second modified layer is 5-96 nm.

11. A quantum dot light-emitting diode, comprising an anode, a quantum dot light-emitting layer and a cathode, the quantum dot light-emitting layer is arranged between the anode and the cathode, wherein further comprising a second modified layer arranged between the cathode and the quantum dot light-emitting layer, the second modified layer comprises PAMAM.

12. A preparation method of a quantum dot light-emitting diode, wherein comprising a plurality of steps:
 providing an anode,
 preparing a first modified layer on the anode, the first modified layer comprises PAMAM, the PAMAM has transition metal cation doped,
 preparing a quantum dot light-emitting layer on the first modified layer,
 preparing a cathode on the quantum dot light-emitting layer.

13. The preparation method according to claim 12, wherein the first modified layer is composed of the PAMAM having the transition metal cation doped.

14. The preparation method according to claim 12, wherein the PAMAM has anion doped.

15. The preparation method according to claim 12, wherein the steps of preparing a quantum dot light-emitting layer on the first modified layer and preparing a cathode on the quantum dot light-emitting layer, comprising: preparing a quantum dot light-emitting layer on the first modified layer, preparing a second modified layer on the quantum dot light-emitting layer, preparing a cathode on the second modified layer, the second modified layer comprises the PAMAM.

16. The preparation method according to claim 12, wherein a molar ratio of the transition metal cation to the PAMAM in the first modified layer is 0.01-720.

17. The preparation method according to claim 12, wherein a transition metal of the transition metal cation is one or more selected from the group consisting of Cu, Ni, Zn, Co, Fe, Mn, Cr, V, Ti, Sc, Y, Zr, Nb, Mo, Tc, Ru, Rh, Pb, Ag, Cd, Hf, Ta, W, Re, Os, Ir, Pt, Au and Hg.

18. The preparation method according to claim 14, wherein the anion is one or more selected from the group consisting of $Cl^-$、$CO_3^-$、$S^{2-}$、$SO_4^{2-}$、$SO_3^{2-}$、$MnO_4^2$、$MnO_4^-$、$PO_4^{3-}$、$NO_3^-$、$NO_2^-$、$ClO_3^-$、$ClO^-$、$ClO_2^-$、$ClO_4^-$、$CN^-$、$AlO_2^-$、$AlO_3^{3-}$、$C_2O_4^{2-}$、$FeO_4^{2-}$、$Cr_2O_7^{2-}$、$CrO_4^{2-}$ and $SeO_4^{2-}$.

19. The preparation method according to claim 12, wherein a thickness of the first modified layer is 2-110 nm.

20. The preparation method according to claim 15, wherein a thickness of the second modified layer is 5-96 nm.

\* \* \* \* \*